(12) United States Patent
Sugiyama et al.

(10) Patent No.: US 6,509,587 B2
(45) Date of Patent: Jan. 21, 2003

(54) SEMICONDUCTOR DEVICE

(75) Inventors: Naoharu Sugiyama, Yokohama (JP); Tsutomu Tezuka, Yokohama (JP); Tomohisa Mizuno, Yokohama (JP); Shinichi Takagi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/955,144

(22) Filed: Sep. 19, 2001

(65) Prior Publication Data

US 2002/0038898 A1 Apr. 4, 2002

(30) Foreign Application Priority Data

Sep. 29, 2000 (JP) ......................... 2000-298439

(51) Int. Cl.[7] .................. H01L 35/0328; H01L 31/117; H01L 31/0392
(52) U.S. Cl. ..................... 257/192; 257/190; 257/194; 257/195; 257/616; 257/347; 257/350
(58) Field of Search ................. 257/649, 192, 257/197, 289, 370, 378, 410, 411, 565, 651, 198, 616, 591, 592, 596, 190, 194, 195, 307, 347, 350

(56) References Cited

U.S. PATENT DOCUMENTS

| | | | |
|---|---|---|---|
| 5,216,271 A | | 6/1993 | Takagi et al. |
| 5,218,213 A | | 6/1993 | Gaul et al. |
| 5,241,214 A | * | 8/1993 | Herbots et al. ............. 257/192 |
| 5,461,243 A | | 10/1995 | Ek et al. |
| 5,476,813 A | | 12/1995 | Naruse |
| 5,583,059 A | * | 12/1996 | Burghartz ............ 148/DIG. 10 |

FOREIGN PATENT DOCUMENTS

JP 10-41400 * 2/1998

* cited by examiner

*Primary Examiner*—Minh Loan Tran
*Assistant Examiner*—Tan Tran
(74) *Attorney, Agent, or Firm*—Oblon, Spivak, McClelland, Maier & Neustadt, P.C.

(57) ABSTRACT

High-speed and low-power-consuming transistors such as field effect transistors having strained Si channels and hetero-bipolar transistors are integrated with each other. Used here is a complex structure in which an MOSFET having a thin-film SiGe buffer layer and a strained Si channel are laminated on an insulating film and an HBT having an SiGe base layer formed on a thin-film SiGe layer by epitaxial growth and an Si emitter layer formed on the SiGe base layer are combined with each other. The thin-film SiGe layer formed on the insulating film of the MOSFET is made thinner than the counterpart of the HBT. The thin-film SiGe layer formed on the insulating film of the MOSFET has Ge concentration higher than that of the counterpart of the HBT.

10 Claims, 15 Drawing Sheets (a)

(b)

SEMICONDUCTOR DEVICE

CROSS REFERENCE TO RELATED APPLICATIONS

This application is based upon and claims the benefit of priority from the prior Japanese Patent Applications No. 2000-298439 filed on Sep. 29, 2000; the entire contents of which are incorporated herein by reference.

BACKGROUND OF THE INVENTION

1. Field of The Invention

The present invention relates to a semiconductor device and a method of producing the semiconductor device. More specifically, this invention relates to a semiconductor device on which high-speed and low power-consuming transistors, particularly, field-effect transistors having strained silicon (Si) as channels and hetero-junction transistors are integrated.

2. Description of Related Art

In an npn bipolar transistor, hetero-bipolar transistors (HBTs) having a semiconductor material with a bandgap width wider than that of the base have been known for enhanced electron injection efficiency in which reverse injection of hole from the base to the emitter is restricted. Particularly, AlGaAs/GaAs HBTs have excellent reverse injection of hole restriction efficiency due to a band discontinuity of a valence band larger than that of a conduction band between the emitter and the base.

As bipolar transistors including Si, already produced are HBTs having strained SiGe, for the base layer, with a bandgap width narrower than that of Si. Such an HBT is shown in FIG. 16A. An energy band structure for the main components of the HBT is shown in FIG. 16B.

As shown in FIG. 16A, in the HBT, a collector section 102 is formed on an Si substrate. An SiGe crystal layer 104 is formed on the collector section 102 as a base layer by a thin-film deposition technique such as LPCVD (Low pressure Chemical Vapor Deposition). Laminated on the SiGe crystal layer 104 are an insulating film 105 having an opening, and an Si layer 106 as emitter via the insulating layer 105. This structure is a double-hetero structure with base-emitter and base-collector hetero-junctions.

As apparent from FIG. 16B, this double-hetero structure could cause a slow operating speed due to charge-up occurring on the base-collector side during large-current injection.

The major advantage of such HBTs having thin SiGe-film layers is that a complex structure with Si-CMOSFETs is designed easier than HBTs composed of GaAs-compound semiconductors. For instance, one achievement according to the advantage is a complex element having high-frequency (analog) circuitry with HBTs for high-output current gain and Si-CMOS logic circuitry.

It is known that mobility of electrons or holes is enhanced with a modulated-band structure due to stress applied to Si or SiGe crystals. There are several proposals on element structures or announcement on sample elements that have taught electron and hole mobility of two times or more for a strained Si layer formed on lattice-relaxed SiGe crystals.

A known method of producing an FET using a strained Si layer is to grow an SiGe layer having Ge composition in the range from 20% to 30% on a general Si substrate to form a lattice-relaxed SiGe layer (virtual substrate), with an Si layer thinner than the critical film thickness laminated thereon. The strained Si layer exposed to the substrate surface in this structure allows experimental production of an MOSFET with procedures similar to those for known Si-MOSFETS.

As explained, one achievement is a complex element with HBTs having thin SiGe-base layers formed on Si substrates and known Si-CMOSs. Also proposed is an FET having an SiGe layer as a virtual substrate grown thick on an Si substrate by using strained Si.

It is, however, difficult to produce a complex element having CMOSs or HBTs with SiGe layers as virtual substrates grown thick on Si substrates due to difficulty in element isolation when multiple number of these elements are integrated.

SUMMARY OF THE INVENTION

A purpose of the present invention is, in view of the problems discussed above, to provide a structure and a method for a complex element having HBTS and MOSFETs using strained Si on lattice-relaxed SiGe crystals.

In order to fulfil the purpose, an aspect of the present invention employs a complex structure in which an MOSFET having a thin-film SiGe buffer layer and a strained Si channel laminated on an insulating film and an HBT having an SiGe base layer formed on a thin-film SiGe layer by epitaxial growth and an Si emitter layer formed on the SiGe base layer are combined with each other.

It is preferable that the thin-film SiGe layer formed on the insulating film of the MOSFET is made thinner than the counterpart of the HBT. It is also preferable that the thin-film SiGe layer formed on the insulating film of the MOSFET has Ge concentration higher than that of the counterpart of the HBT.

A semiconductor device according to another aspect of the present invention comprises: a insulating layer; a field effect transistor including a buffer layer composed of a first semiconductor, formed on the insulating layer, and a strained semiconductor layer composed of a second semiconductor having a lattice constant smaller than that of the first semiconductor, formed on the buffer layer, the strained semiconductor layer being provided with a channel area, a source area and a drain area; and a bipolar transistor including a collector layer composed of a third semiconductor, formed on the insulating layer, a base layer composed of a fourth semiconductor having a lattice constant about the same as or larger than that of the third semiconductor, formed on the collector layer, and an emitter layer composed of a fifth semiconductor having a lattice constant smaller than those of the third and fourth semiconductors formed on the base layer.

A method of producing the above-described semiconductor device according to an aspect of the present invention comprises: forming a wafer having an insulating layer and a semiconductor layer involving silicon and germanium formed on the insulating layer; oxidizing a first portion of the semiconductor layer from the surface of the semiconductor layer to form an oxide film to increase Ge concentration of the semiconductor layer remaining under the oxide film; forming the field effect transistor with the semiconductor layer, of which the Ge concentration has been increased as the buffer layer; and forming the bipolar transistor on a second portion except the first portion of the semiconductor layer, the bipolar transistor having a semiconductor layer portion as the collector layer on which the oxide film has not been formed.

A method of producing a semiconductor device according another aspect of the present invention comprises: forming a wafer having an insulating layer and a semiconductor layer involving silicon and germanium formed on the insulating film; oxidizing a first portion of the semiconductor layer from the surface of the semiconductor layer to form an oxide film to increase Ge concentration of the semiconductor layer remaining under the oxide film; forming an field effect transistor with the semiconductor layer of which the Ge concentration has been increased as a buffer layer; and forming a bipolar transistor on second portion except the first portion of the semiconductor layer, the bipolar transistor having a semiconductor layer portion as a collector layer on which the oxide film has not been formed.

DETAILED DESCRIPTION OF EMBODIMENTS

Embodiments according to the present invention will be disclosed with reference to the attached drawings.

Figure 1:
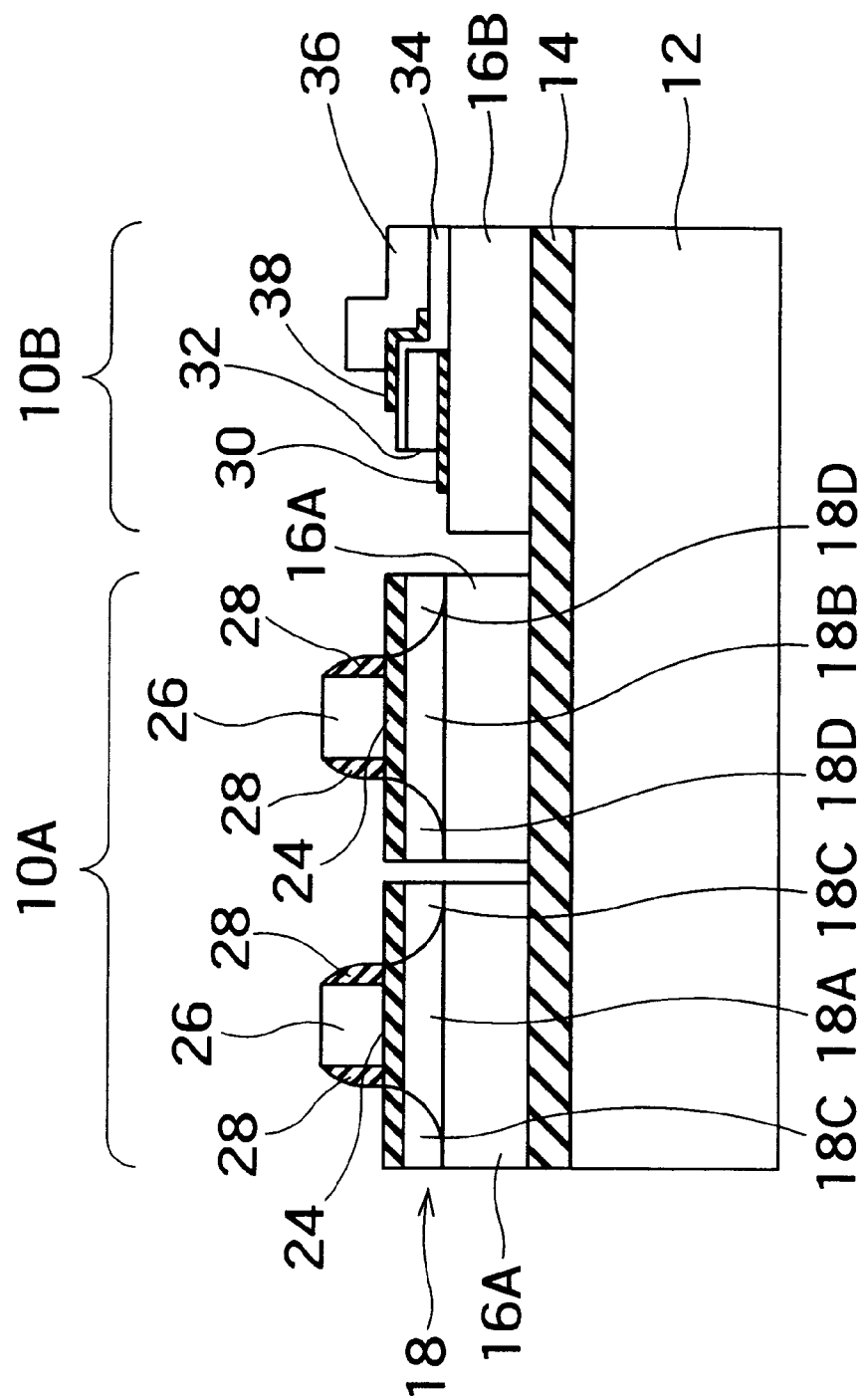
FIG. 1 is a schematic sectional view of an example of main components of a semiconductor device according to an embodiment of the present invention.

FIG. 1 is a schematic sectional view of an example of main components of a semiconductor device according to an embodiment of the present invention.

The semiconductor device according to an embodiment of the present invention is provided with an FET section 10A and an HBT section 10B on a semiconductor substrate 12 via an insulating film 14.

The FET section 10A will be explained first. Formed on the insulating film 14 are strained Si layers 18 via a lattice-relaxed SiGe buffer layers 16A. A portion of each strained Si layer 18 is a channel area 18A or 18B. Formed at both end portions of the channel area 18A are source-drain areas 18C doped at a high level. Also formed at both end portions of the channel area 18B are source-drain areas 18D. A gate electrode 26 is provided on each of the channel areas 18A and 18B via a gate-insulating film 24. Side-wall sections 28 are formed at both sides of the gate electrode 26. Electrodes 29 are provided on the source-drain areas 18C and 18D.

The HBT section 10B will be explained next. Formed on the insulating film 14 are a collector layer 16B made of lattice-relaxed n-type SiGe, a base layer 34 made of lattice-relaxed p-type SiGe and an emitter layer 36 made of n-type Si. An insulating film 30 and an outer base 32 are provided between the collector layer 16B and the base layer 34. Another insulating film 38 is provided between the base layer 34 and the emitter layer 36.

The structure according to the embodiment of the present invention allows production of an MOSFET with higher mobility by means of the strained Si layer 18, as a channel, laminated on each lattice-relaxed SiGe buffer layer 16A.

Moreover, the structure according to another aspect of the present invention allows production of a high-speed CMOS-FET and HBT with materials of the same type with easy element-isolation procedures by producing the HBT having the lattice-relaxed SiGe layer 16B as a collector layer on the insulating film 14, the thin SiGe layer 34 as a base layer grown on the layer 16B and the Si emitter layer 36 laminated thereon.

Since transistors are formed on the small semiconductor areas 16A and 16B on the insulating film 14 in the FET and HBT sections 10A and 10B, respectively, it is possible to decrease the floating capacitance, thereby transistors can be operated at high-speed.

The thin SiGe-film 16A, on the insulating film 14 in the FET section 10A, formed thinner than the SiGe layer 16B in the HBT section 10B offers operating conditions in which depletion occurs at the substrate side in the FET section 10A with no decrease in corrector resistance in the HBT section 10B.

The thickness for the SiGe layer 16B in the HBT section 10B is preferably in the range between 30 nm to 500 nm. The thickness of 30 nm or less causes high collector resistance that is disadvantageous for high-speed operations. On the other hand, the thickness of 500 nm or more causes a large height difference between this HBT section and the FET section, which will pose problems in production.

The thickness for the SiGe layer 16A in the FET section 10A is preferably in the range from 5 nm to 50 nm, more preferably, from 10 nm to 30 nm. The maximum thickness is decided for fully depletion. The thinner the better for the SiGe layer in restriction of short channel effect which may otherwise occur in ultra fine devices. The minimum thickness is decided so as not to have any problems in the structure. For example, the SiGe layer 16A is preferably thicker than the Si layer 18 for lamination of a 5 nm- to 10 nm-thick strained Si channel layer 18 on the lattice-relaxed SiGe layer 16A, which may otherwise cause a problem in that the SiGe layer 16A absorbs lattice-mismatching between the layer 16A and the Si layer 18 due to compressive stress so that strain cannot be applied to the Si layer side.

The Ge concentration of the thin-film SiGe layer in the FET section 10A higher than that of the SiGe layer in the HBT section 10B is useful applying large strain to the channel areas 18A and 18B in the FET section 10A for higher mobility while decreasing the emitter-base lattice-mismatching.

The Ge concentration of the thin SiGe layer 16A in the FET section 10A is preferably in the range from 10% to 60%, more preferably, 30% to 50%. The minimum Ge concentration is decided in accordance with magnitude of strain to be applied to the Si layer. The Ge concentration of 10% or less cannot serve to apply enough strain to the Si layer 18 laminated on the SiGe layer 16A, thus strained Si channel effect cannot be expected. On the other hand, the maximum Ge concentration depends on the structure. The larger the stress applied to the strained Si channel layers 18A and 18B, the higher the mobility in the channels. A very large difference in Ge composition between the SiGe layer and the Si layer and also a very large lattice-mismatching cause loosening in all layers due to occurrence of dislocation. This results in, for example, that strained Si channel effect cannot be expected and a leak current flows due to defect.

The Ge concentration of the SiGe layer 16B in the HBT section 10B is preferably in the range from 5% to 30%, more preferably, 10% to 20%. It is preferable that SiGe composition for the SiGe layer 16 in the HBT section 10B is the same as Ge composition for the SiGe layer 34 at the base section laminated on the layer 16 under consideration of the degree of band discontinuity to the Si-emitter layer 36 formed on the layer 34.

The larger the lattice constant for the SiGe crystals, the smaller the bandgap in the range discussed here. The higher the GE composition, the larger the lattice constant. In detail, the lattice constant becomes larger whereas the bandgap becomes smaller as more Ge is applied to Si.

The difference between a wide Si bandgap width and a narrow SiGe bandgap width is more distributed to the valence band for the Si/SiGe hetero-junction, which thus not obstruct electron flow from the emitter for restriction of reverse injection of hole from the base. A barrier large enough compared to thermal energy (25 meV) in room temperature contributes to the restriction of reverse injection of hole.

Therefore, there is adequate range for the Ge concentration. The Ge composition for the SiGe layer 16B is preferably in the range from 30% to 50% when the base layer 34 is formed in the graded composition structure, which will be disclosed later.

Figure 2A:
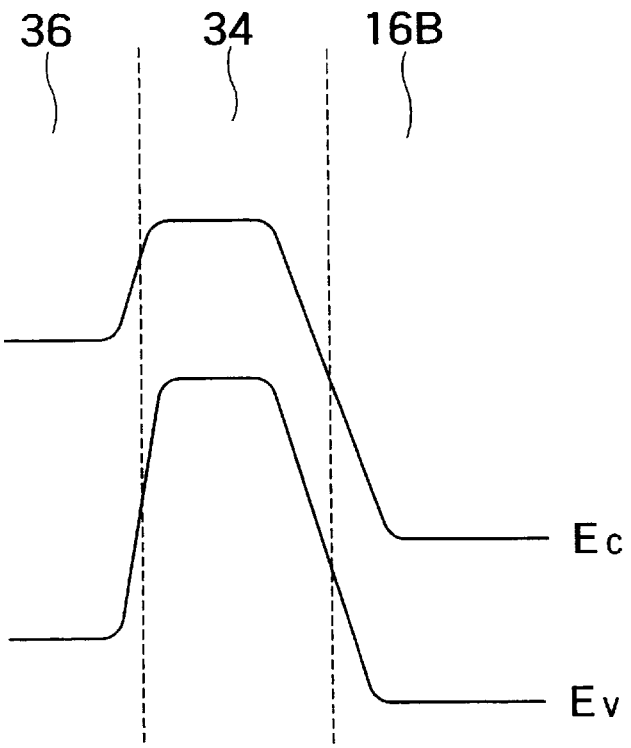
FIG. 2A is a schematic sectional view of a band structure for an HBT section of a semiconductor device according to an embodiment of the present invention.

FIG. 2A is a schematic sectional view of a band structure for the HBT section 10B of a semiconductor device according to the present invention.

As apparent from the diagrams of the valence band Ev and the conduction band Ec, the single hetero-junction is formed only at a base-emitter interface in the structure having the lattice-relaxed n-type SiGe layer 16B as the collector with the p-type lattice-relaxed SiGe base layer 34 and the n-type strained si layer 36 as the emitter laminated thereon. This structure rarely suffers from low performance which may otherwise occur due to charge-up to the collector layer 16B, in other words, keeps high performance.

Figure 2B:
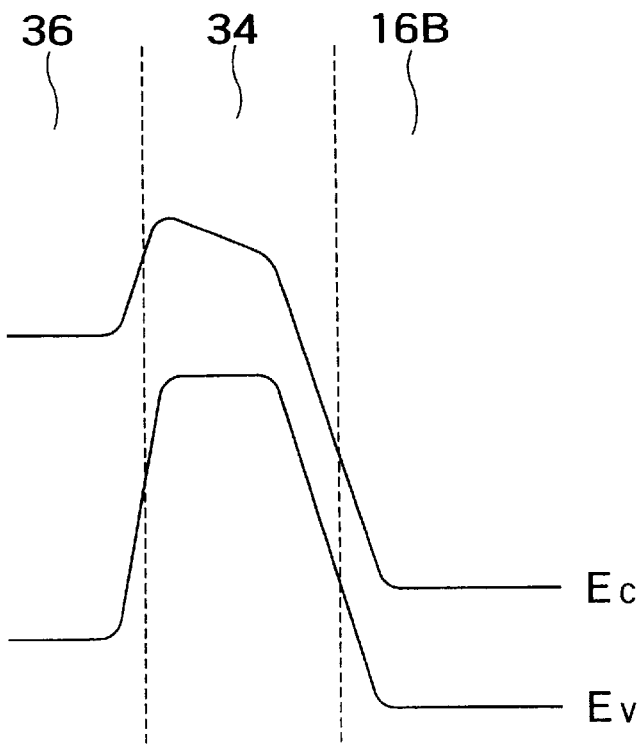
FIG. 2B is a schematic sectional view of a band structure with a graded composition structure in which Ge composition is gradually varying in a base layer of an HBT section of a semiconductor device according to an embodiment of the present invention.

FIG. 2B illustrates a band structure for the base layer 34 formed in the graded composition structure in which Ge composition is gradually varying. Shown in this figure is that the base layer 34 is joined to the Si emitter layer 36 in a way that the Ge composition for the base layer 34 is gradually decreased from 30% to 15% in the direction from the collector to emitter side while the Ge composition for the collector layer 16B is constant at 30%. This structure gives potential variation in the conduction band of the base layer 34, so that accelerated energy is applied to electrons moving through the base layer from the electric field for higher-speed operations.

Known double-hetero-structured HBTs having Si-emitter, SiGe-base and Si-collector are disadvantageous when such a graded composition structure is employed due to band discontinuity occurred between the base and collector layers, which will cause charge-up. Such known HBTs are also disadvantageous for lattice-mismatching that is a cause of defects.

On the other hand, the present invention provides 30% or more to the collector Ge composition in the device structure, which thus achieves the graded composition structure in which a large electric field is applied to the base layer 34 while keeping a band structure discontinuous enough for restricting the emitter-base reverse injection of hole.

The SiGe layers 16A, 16B and 34 may involve C (carbon) in embodiments of the present invention. Carbon involved in either one of or all of the semiconductor layers offers the same advantages discussed above. Not only that, involvement of C allows wide adjustment of amounts of lattice strain and band discontinuity while restricting diffusion of dopant impurities.

Embodiments according to the present invention will be disclosed further in detail.
(First Embodiment)

Figure 3:
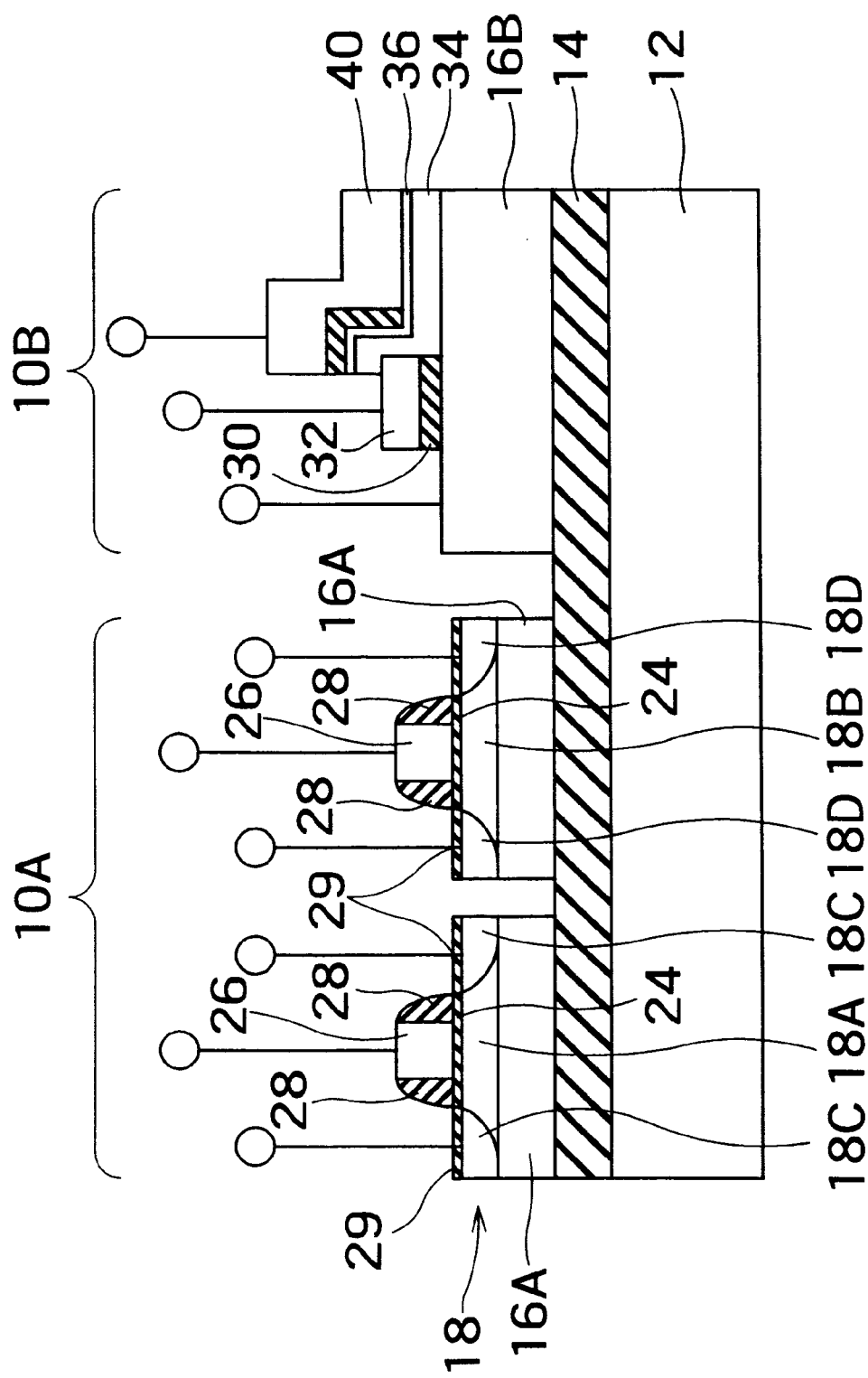
FIG. 3 is a schematic sectional view of main components of a semiconductor device according to the first embodiment of the present invention.
Figure 4:
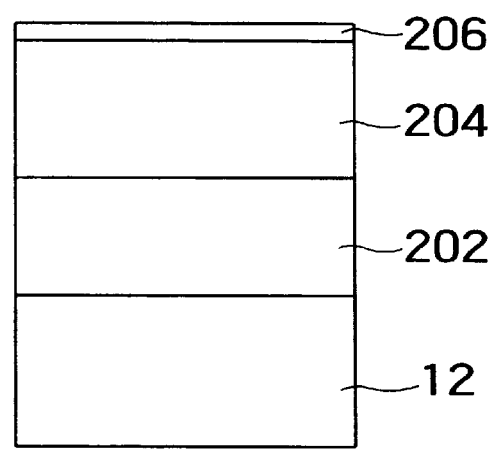
FIG. 4 is a sectional view showing main steps of a method of producing a semiconductor device according to the first embodiment of the present invention.
Figure 4:
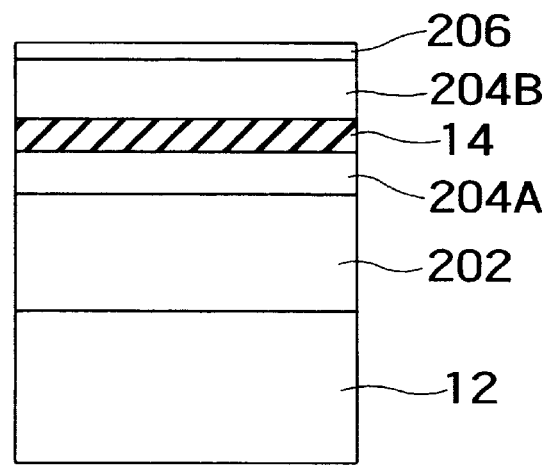
Figure 5:
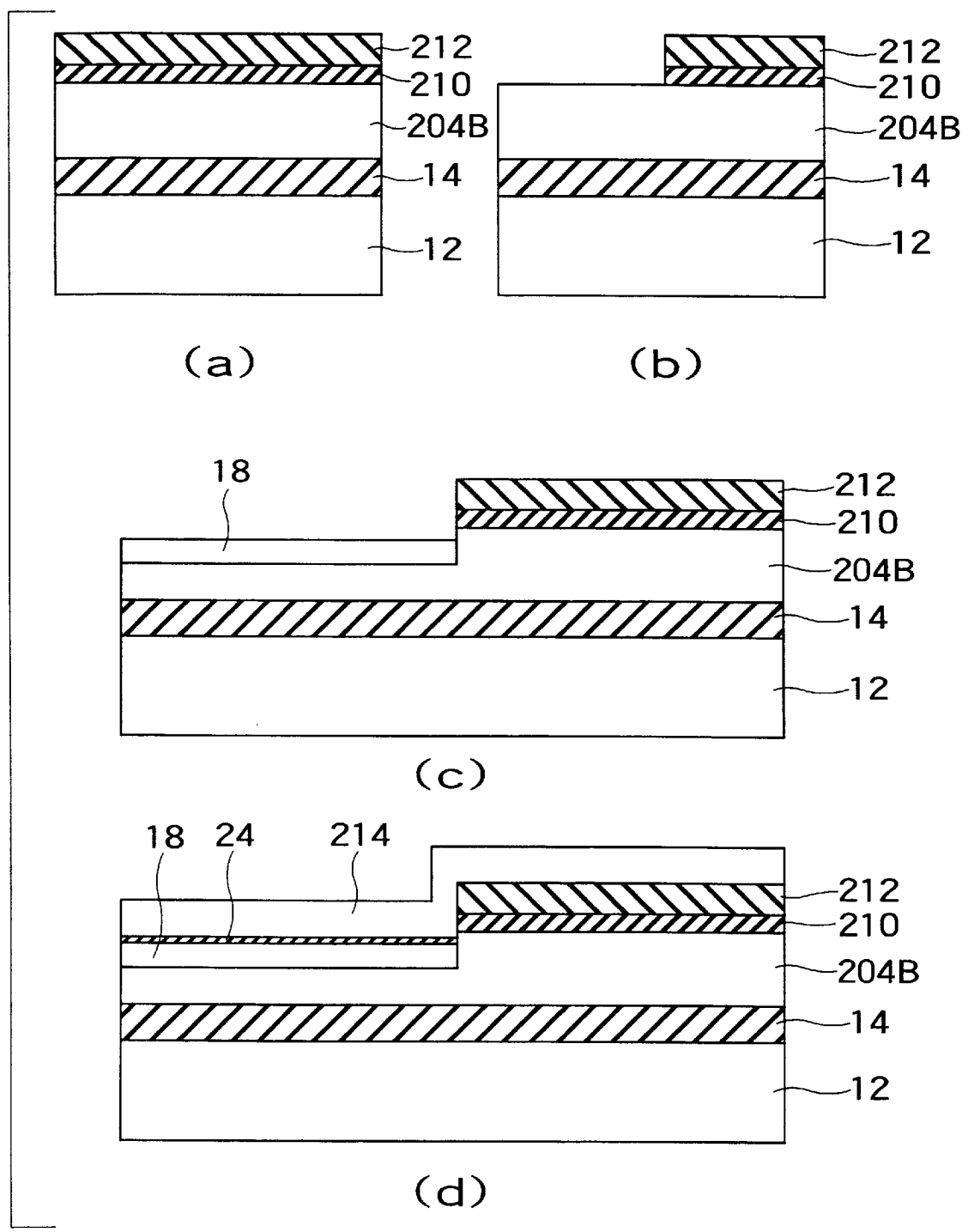
FIG. 5 is a sectional view showing main steps of a method of producing a semiconductor device according to the first embodiment of the present invention.
Figure 6:
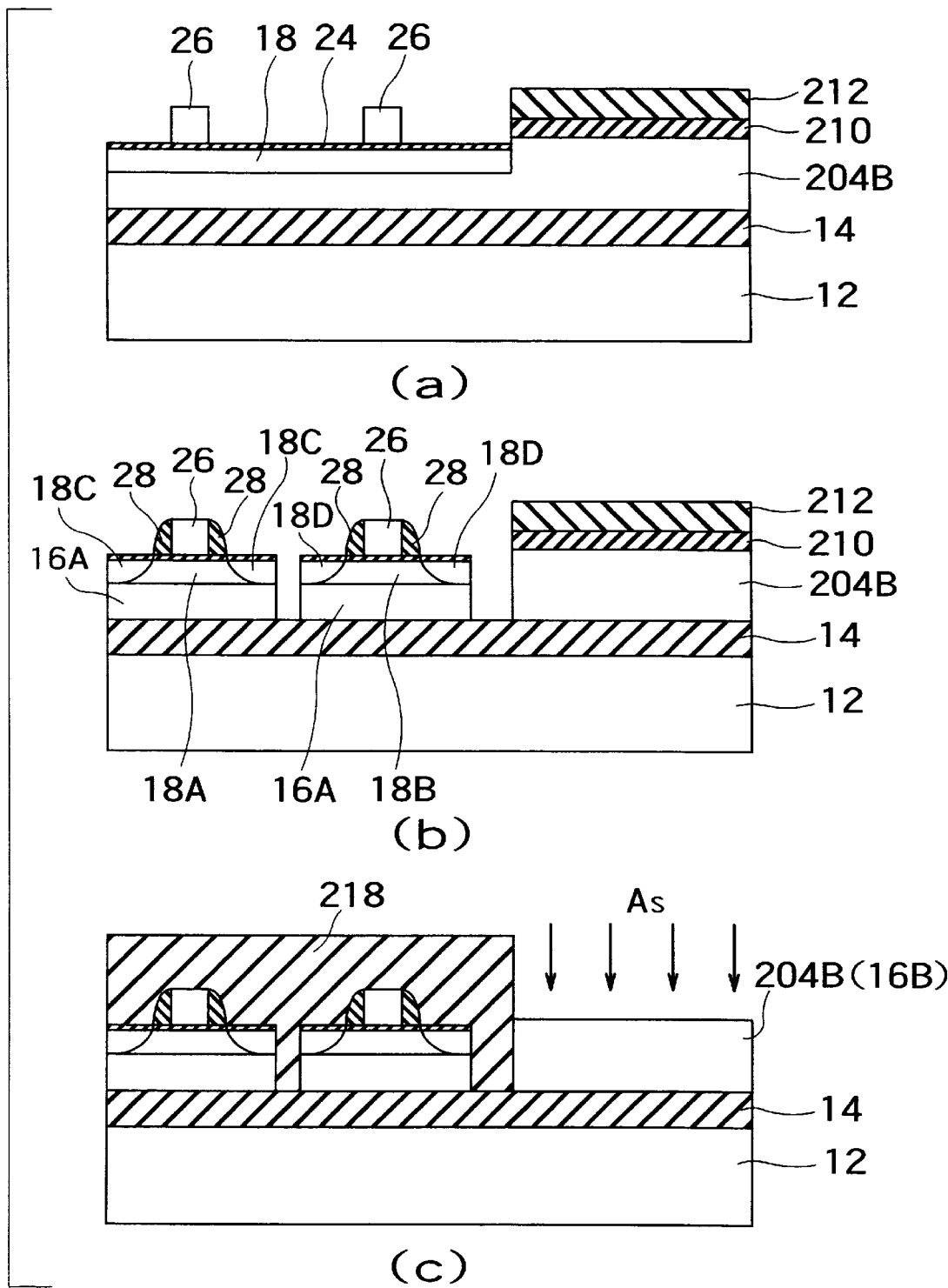
FIG. 6 is a sectional view showing main steps of a method of producing a semiconductor device according to the first embodiment of the present invention.
Figure 7:
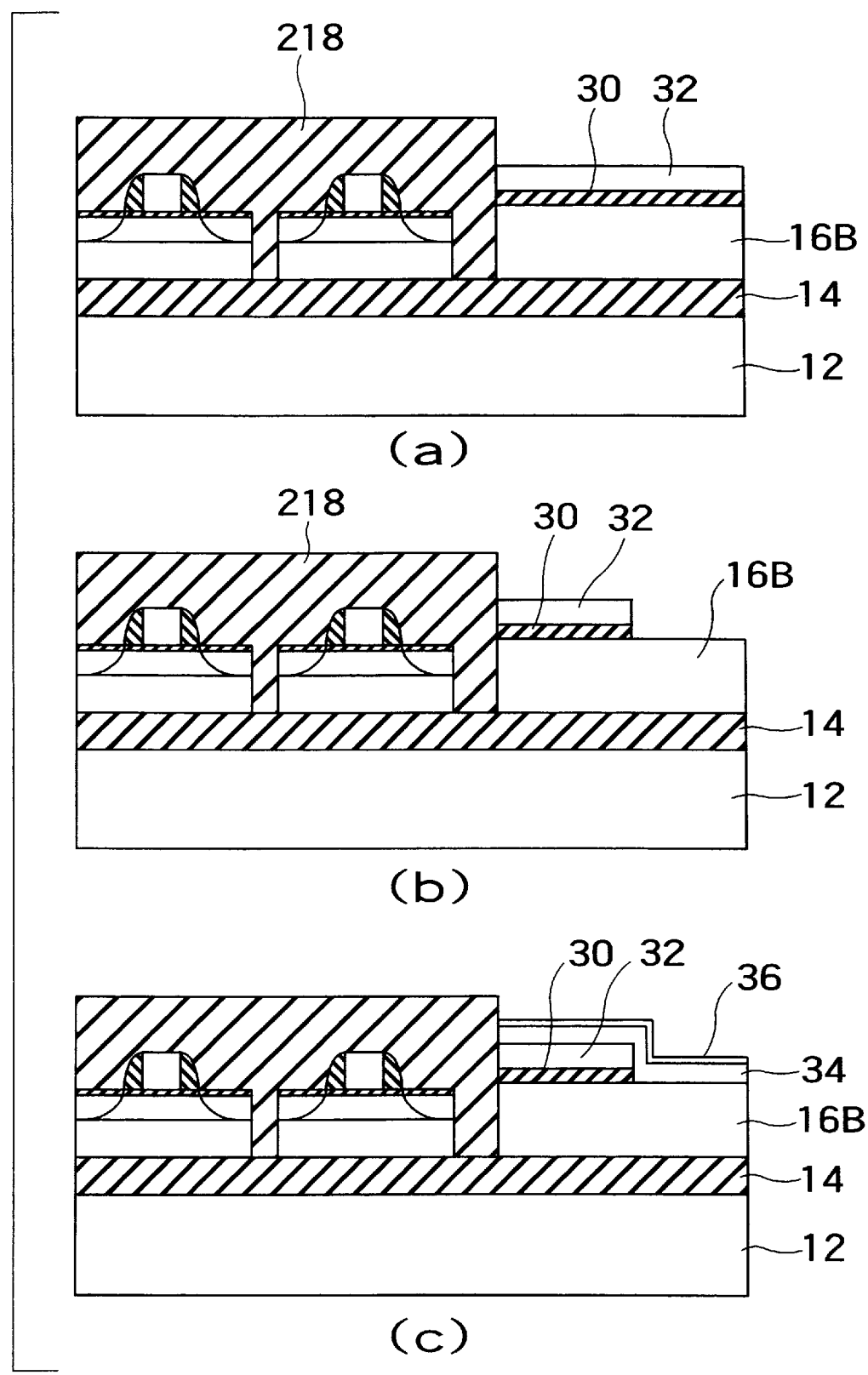
FIG. 7 is a sectional view showing main steps of a method of producing a semiconductor device according to the first embodiment of the present invention.
Figure 8:
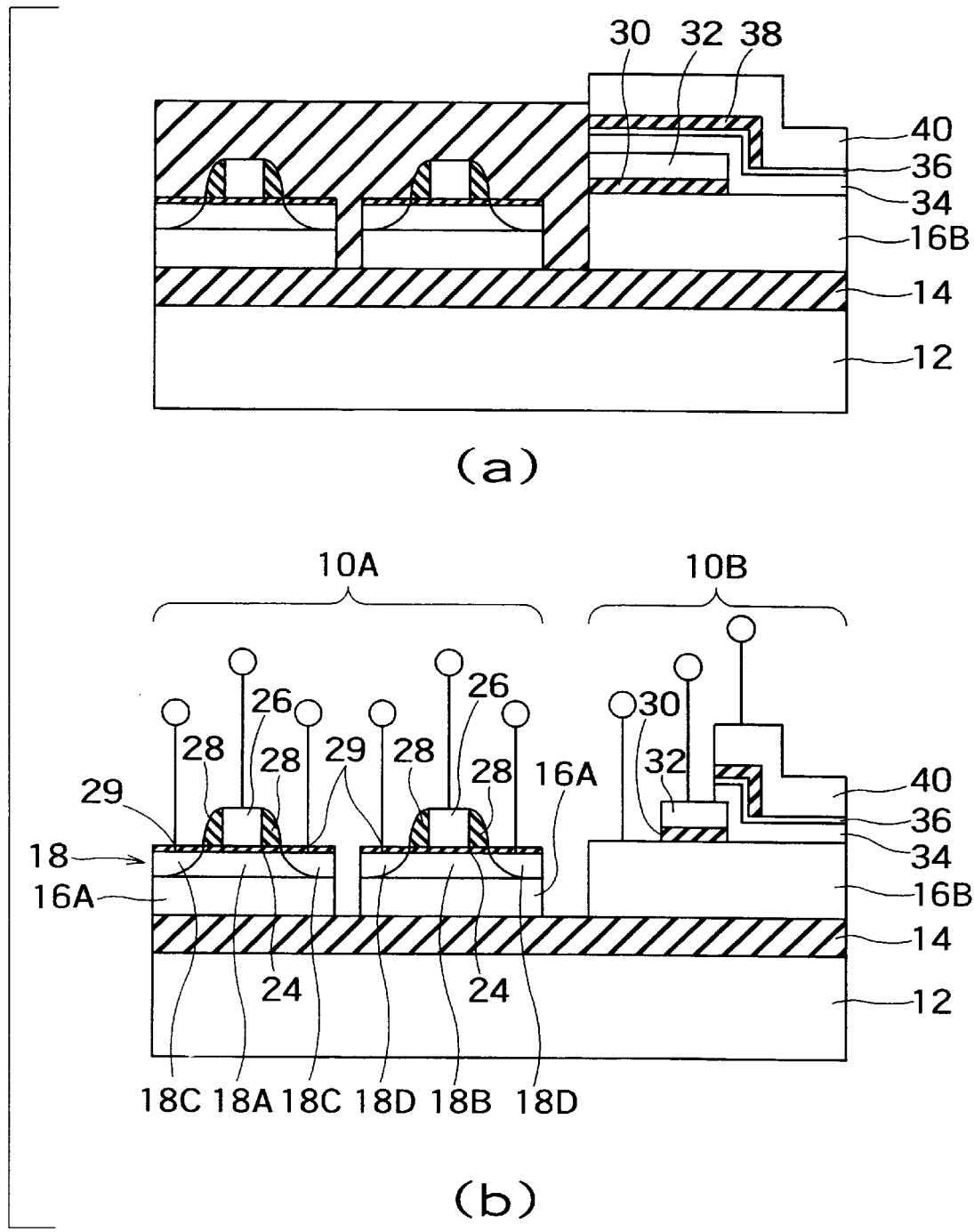
FIG. 8 is a sectional view showing main steps of a method of producing a semiconductor device according to the first embodiment of the present invention.

FIG. 3 is a schematic sectional view of main components of a semiconductor device according to the first embodiment of the present invention.

Transistors in this embodiment that are the same as or analogous to the transistors shown in FIGS. 1, 2A and 2B are referenced by the same reference numbers.

In this embodiment, a buried-oxide film 14 is formed on a (001) Si substrate 12, with FET and HBT sections 10A and 10B formed thereon.

The FET section 10A will be disclosed first. Laminated on the buried-oxide film 14 are a lattice-relaxed SiGe buffer layers 16A and strained Si layers 18, with gate electrodes 26 and source/drain electrodes 29 formed on the layers 18, thus constituting a CMOSFET section.

Each gate electrode 26 is formed by depositing a poly-crystalline Si layer on an about 3 nm-thick gate-insulating film 24. The film 24 is formed by thermal oxidation to the surface of each strained Si layer 18.

The HBT section 10B will be explained next.

Formed on the insulating film 14 are a collector layer 16B made of lattice-relaxed n-type SiGe, a 50 nm-thick base layer 34 made of lattice-relaxed p-type SiGe and an emitter layer 36 made of n-type Si. An insulating film 30 and an outer base 32 are provided between the collector layer 16B and the base layer 34. Another insulating film 38 and an outer emitter 40 are provided on the emitter layer 36.

Disclosed next is a method of producing a semiconductor device in this embodiment.

The following are three methods, as techniques on component materials, for achieving the structure in which the lattice-relaxed SiGe layers 16A and 16B are directly joined onto the insulating film 14 as shown in FIG. 3.

(1) SiGe-epitaxial growth on a thin SOI (Silicon on Insulator) having a silicon layer formed on an oxide-film layer that is formed on another silicon layer (A. R. Powell et al., Appl. Phys. Lett. 64, 1856 (1994))

(2) Bonding an oxide film formed on an Si substrate to an SiGe laminated-structure formed on an Si substrate by epitaxial growth followed by partial removal of the SiGe laminated structure (Japanese Patent NOs. 3037934 and 2908787), and (3) oxygen-ion implantation into an SiGe layer with high-temperature annealing to form a buried-oxide film in the SiGe layer.

The buried-oxide layer 14 is formed as one example in this embodiment, by direct oxygen-ion implantation into an SiGe layer of 1 µm or more in thickness with annealing.

FIGS. 4 to 8 are sectional views showing main steps of a method of producing a semiconductor device in this embodiment.

As shown in FIG. 4(a), an SiGe layer 202 having the graded composition structure, an $Si_{0.8}Ge_{0.2}$ layer 204 and an Si layer 206 are deposited in this order on a p-type (100) Si wafer 12 having an electric resistivity in the range from 4.5 Ω to 6 Ω as a substrate.

The thin film deposition of each layer on the Si substrate 12 is performed by a high vacuum CVD apparatus. Gases used for CVD are $Si_2H_6$ and $GeH_4$ without impurity doping. Major film-deposition requirements are 650° C. in substrate temperature, 30 mPa in $Si_2H_6$-gas partial pressure and 60 mPa in $GeH_4$ partial pressure.

The deposited films have a laminated structure of the layer 202 having the graded composition structure in which Ge composition is gradually varying, the layer 204 having a composition-constant structure in which Ge composition is constant at 20%, and the 30 nm-thick Si layer 206 as the uppermost layer. The uppermost Si layer 206 acts as a surface-protective layer against SIMOX (Separation by Implanted Oxygen) high-temperature annealing. Most of the uppermost Si layer 206 would be changed into an oxide film ($SiO_2$ layer) during the process.

The buried-oxide film 14 is formed next as shown in FIG. 4(b). In detail, oxygen-ion implantation and high-temperature annealing are performed to a sample on which the SiGe layer has been formed. Actual requirements are 180 keV in oxygen-ion acceleration energy and $4 \times 10^{17}$ ions/cm$^2$ in dose in ion implantation, and 1300° C. and 8 hours in annealing.

This process forms the 100 nm-thick oxide film 14 at the depth of 400 nm from the surface. The film 14 has almost no Ge elements that might be diffused during high-temperature annealing. The SiGe layer 204B formed on the oxide layer 14 is subjected to complete lattice-relaxation. The SiGe layer 204A formed under the oxide film 14 has a low Ge content SiGe layer portion formed deep there into due to Ge diffusion. on the other hand, Ge diffusion is restricted for the SiGe layer 204B formed on the oxide film 14 with the help of a wall of the oxide layer.

Accordingly, formed on the buried-oxide layer 14 is the SiGe layer 204B having 20% in Ge composition and about 400 nm in thickness.

The SiGe layer 204B is then covered with an oxide film 210 and a nitride film 212 as shown in FIG. 5(a). The oxide film 210 (100 nm in thickness) and the nitride film 212 (200 nm in thickness) can be deposited by CVD. Thermal oxidation may be applied to these films as explained later in other embodiments.

A portion of the deposited passivation films is etched away for producing a MOSFET by photolithography to expose the surface of the SiGe layer 204B. In detail, a resist is applied over the nitride film 212 and an opening is formed only for the portion to be etched followed by nitride-film and oxide-film removal by dry-etching and HF processing.

The exposed SiGe layer 204B is etched away and Si-layer is deposited as shown in FIG. 5(c). In detail, performed first are partial removal of the exposed SiGe layer 204B and surface-processing before re-growth. Removal of the oxide film formed by CVD is followed by further oxide-film removal using hydrofluoric acid because a thermal oxide-film layer might have been formed on the substrate surface after SIMOX processing.

Partial etching is applied to the Si and SiGe layers using an etchant including ($HF+HNO_3$). The composition of the etchant including ($HF+H_2NO_3$) is ($HF:H_2O:HNO_3$)= 1:20:50. Etching rates at room temperature are 600 nm/min and 1300 nm/min for Si and SiGe having 20% in Ge composition, respectively. The etching rate can further be lowered for this solution by concentration adjustment. The SiGe layer 204B formed on the oxide film is thinned in this stage to about 100 nm or less, ideally to 5 nm to 10 nm. Such a very thin SiGe layer may, however, not be necessary for a CMOS section, which depends on device design.

Subsequently, a hydrogen termination process is performed on the exposed surface of the SiGe layer 204B by dipping the wafer into an HF solution.

After that, the wafer is set again in the deposition system for thermal processing at 900° C. in a 1Pa-hydrogen atmosphere for surface-layer cleaning before the start of regrowth, followed by deposition of the Si layer 18 of thin-film crystal. The Si layer 18 has been strained due to stress and hence becomes an MOSFET-channel. In detail, Si has lattice constant smaller than that for SiGe, so that tensile stress has been applied to the Si layer 18 in the in-plane direction to generate tensile strain.

The wafer is then put into a furnace for thermal oxidation for formation of a 5nm-thick thermal oxide film 24 on the strained Si layer 18 with deposition of a 100 nm-thick polycrystalline Si layer 214 that will become the gate 26, as shown in FIG. 5(d).

Subsequently, as shown in FIG. 6(a), the polycrystalline Si layer 214 is removed by photolithography while leaving only a polycrystalline Si-layer portion to become the gate 26.

The main FET section is finished as shown in FIG. 6(b). In detail, a side-walls 28 are formed by deposition of an insulating material and etch-back process with impurity-ion implantation suitable for n- and p-types for forming the source/drain areas 18C and 18D and decreasing the resistance of the gate 26. Isolation of n- and p-type FETs is easily performed by etching away the SiGe layer 16A formed on the buried-oxide film 14.

The processes for producing the HBT section start next.

The overall wafer surface is again covered with a passivation film 218 such as an oxide film or a nitride film. Subsequently, the passivation film 218 in the HBT section is removed to expose an SiGe layer 204B that will become the corrector section of a bipolar transistor, as shown in FIG. 6(c). In the same way as for the FET section, the SiGe layer 204B may be etched for thickness adjustment. The etching may be performed so that the SiGe layer 204B has the thickness the same as the counterpart of the FET section. Formed next is an SiGe layer 16B that will become the collector section by ion implantation with arsenic at $3\times10^{17}$ $cm^{-3}$ in concentration.

Next, as shown in FIG. 7(a), a 20 nm-thick oxide film 30 is formed on the surface of the collector section 16B by CVD, with a 100 nm-thick polycrystalline Si layer 32 deposited thereon. The polycrystalline Si layer 32 is subjected to boron-ion implantation and then removed while leaving only an outer base (a leading electrode of the base layer). An opening is formed only at a portion of a CVD-oxide film 30, which corresponds to an intrinsic base.

The opening surface of the collector section is cleaned like performed before deposition of the strained-Si layer described as above and set in a thin-film deposition apparatus for deposition of a 50 nm-thick SiGe layer 34 that has been added boron as impurities at $5\times10^{19}$ $cm^{-3}$, that will become a base layer. The base layer 34 is formed not only on the opened collector section but also over the outer base section 32 to ensure the contact of the base layer with an electrode which will be formed later at the outer base section. Subsequent to the SiGe layer 34, a 2 nm-thick Si layer 36 is formed with addition no dopants.

A 10 nm-thick oxide film 38 is deposited on the surface by CVD to have an opening only at the intrinsic base. A 100 nm-thick polycrystalline Si layer 40 is then deposited with arsenic-ion implantation and also removal of the surroundings while leaving only the portion to become an emitter. Thus, the structure shown in FIG. 8(a) is formed.

The overall structure is then covered with an oxide film (not shown) deposited by CVD with annealing at 900° C./60 sec., for dopant activation after ion implantation. Such annealing may not be performed every time just after ion implantation. It may be performed only once after all ion-implantation processes are finished. This annealing allows partial diffusion of arsenic the impurities that have been implanted into the polycrystalline Si emitter layer 40 so that the impurities enter into the 2 nm-thick Si layer 46 between the emitter layer 40 and the SiGe base layer 34. A p-n junction is thus formed at the interface between the SiGe base layer 34 and the thin-film crystal Si layer 36.

Several openings are formed on the CVD-oxide film that covers the entire surface with deposition of alumina for electrodes to have the structure shown in FIG. 8(b).

In the embodiment described above, a metal such as W can be used as a gate-electrode material for the FET section 10A. As for the gate-insulating film 24, not only an Si-oxide film ($SiO_2$), but also a high-dielectric gate-insulating film such as an Si-nitride film ($Si_3N_4$), an Si-oxynitride film ($SiO_xN_y$) $Al_2O_3$, $Ta_2O_5$, $TiO_2$ or $Y_2O_3$ can be used.

(Second Embodiment)

Disclosed next is a semiconductor device according to the second embodiment of the present invention.

Figure 9:
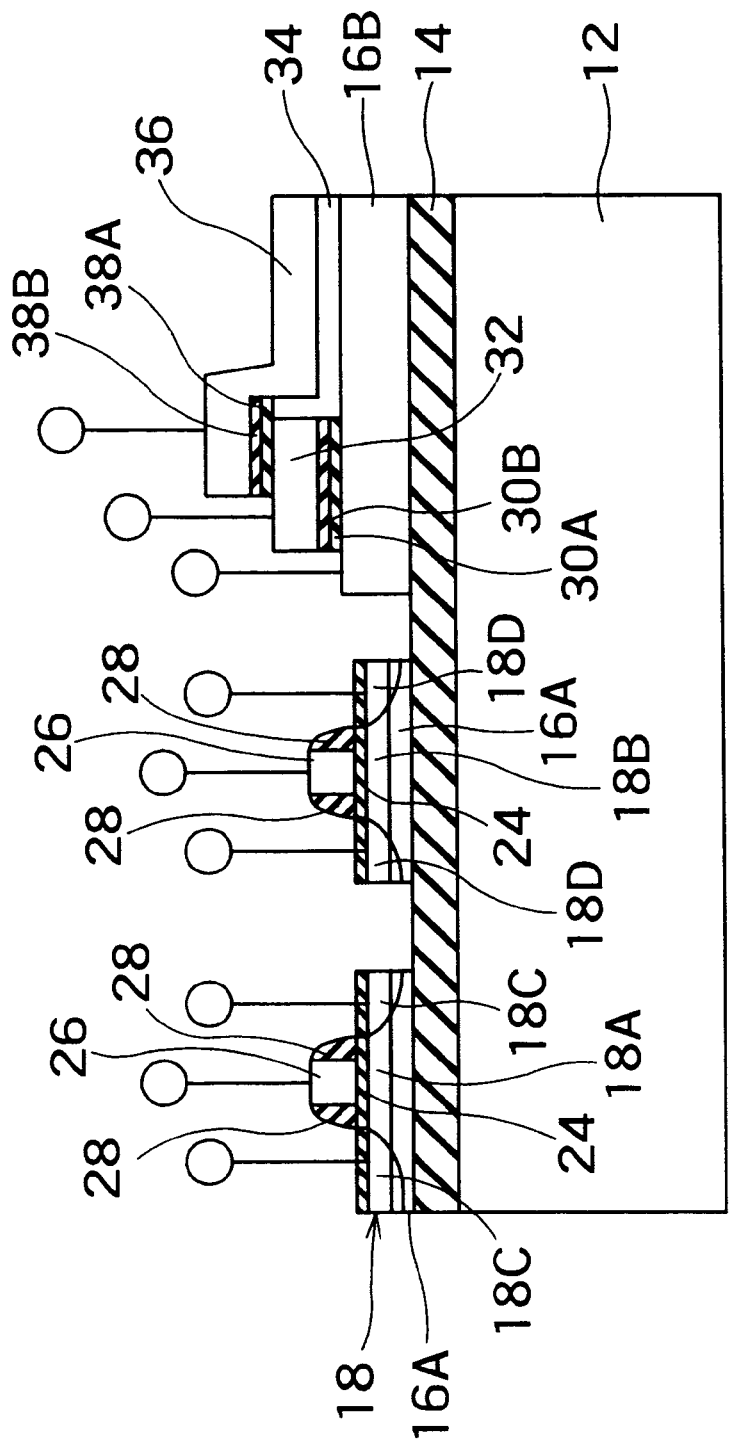
FIG. 9 is a schematic sectional view of main components of a semiconductor device according to the second embodiment of the present invention.
Figure 10:
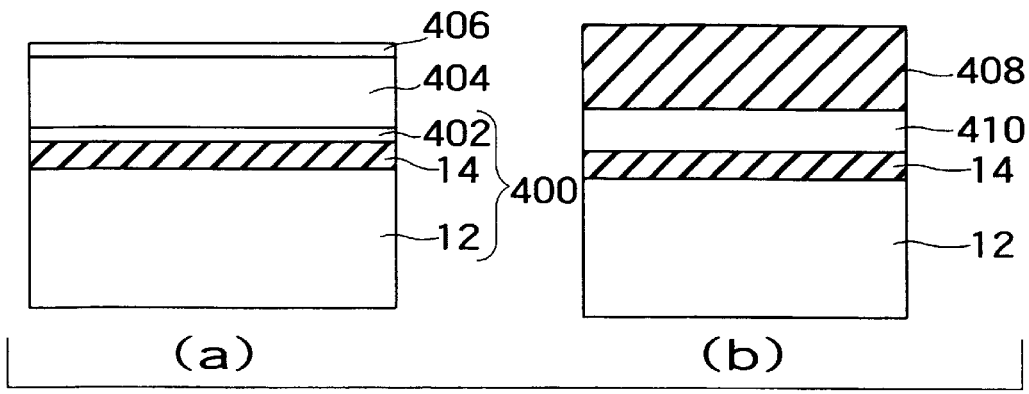
FIG. 10 is a sectional view showing main steps of a method of producing a semiconductor device according to the second embodiment of the present invention.
Figure 11:
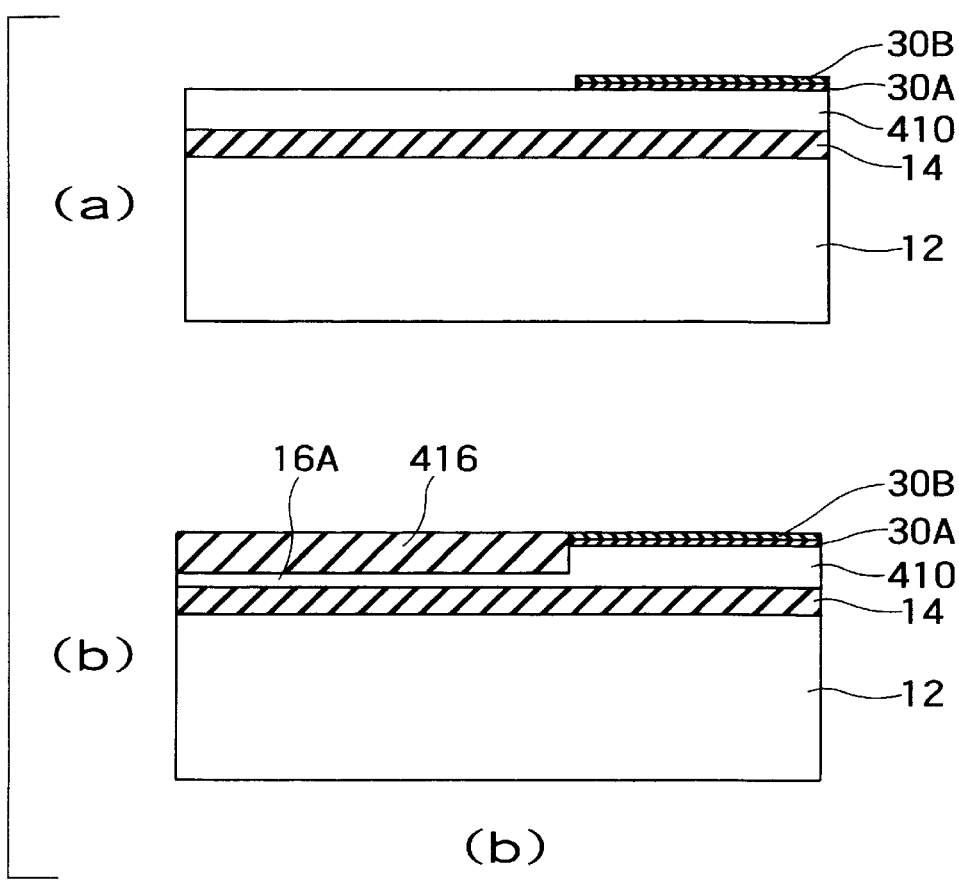
FIG. 11 is a sectional view showing main steps of a method of producing a semiconductor device according to the second embodiment of the present invention.
Figure 12:
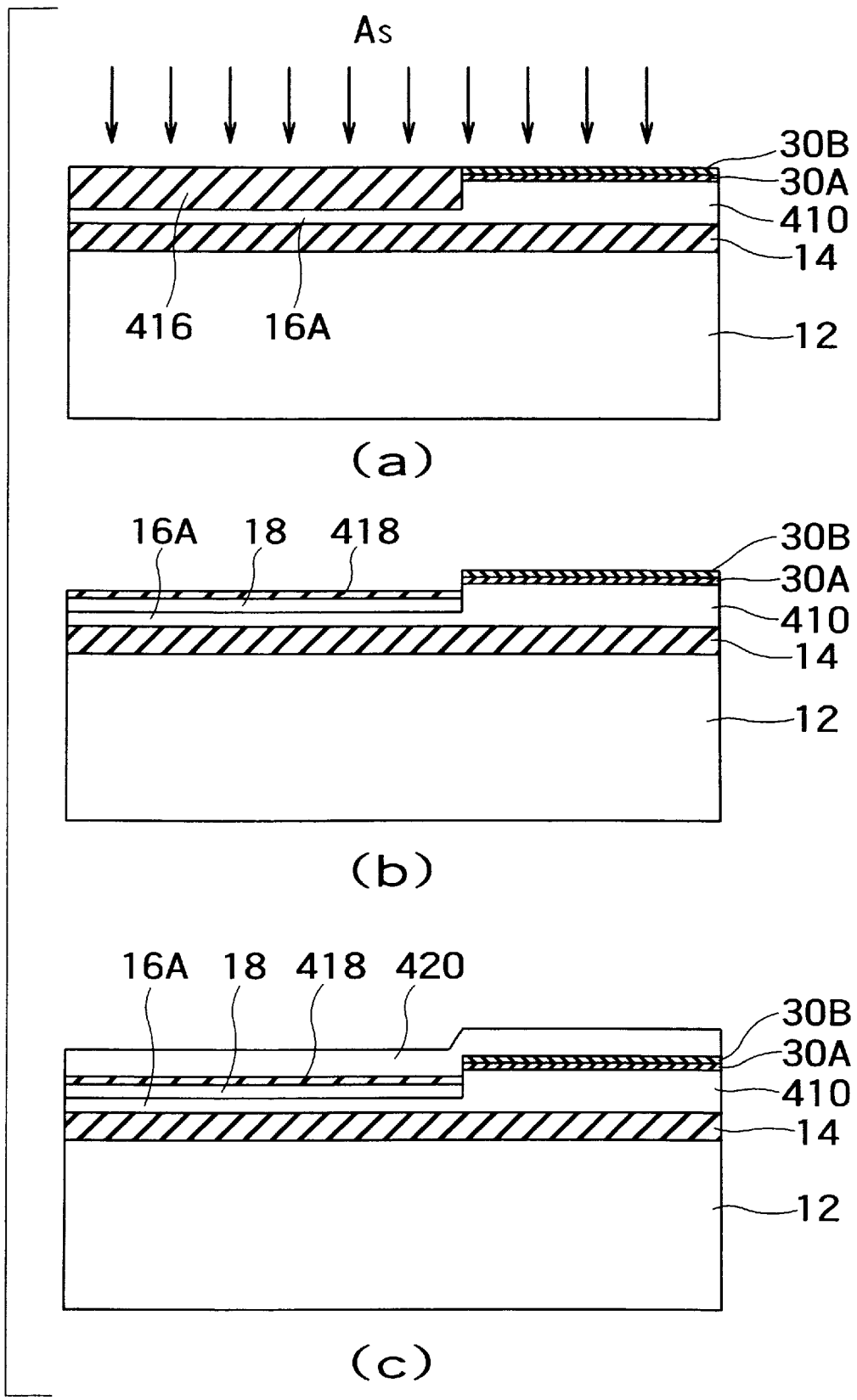
FIG. 12 is a sectional view showing main steps of a method of producing a semiconductor device according to the second embodiment of the present invention.
Figure 13:
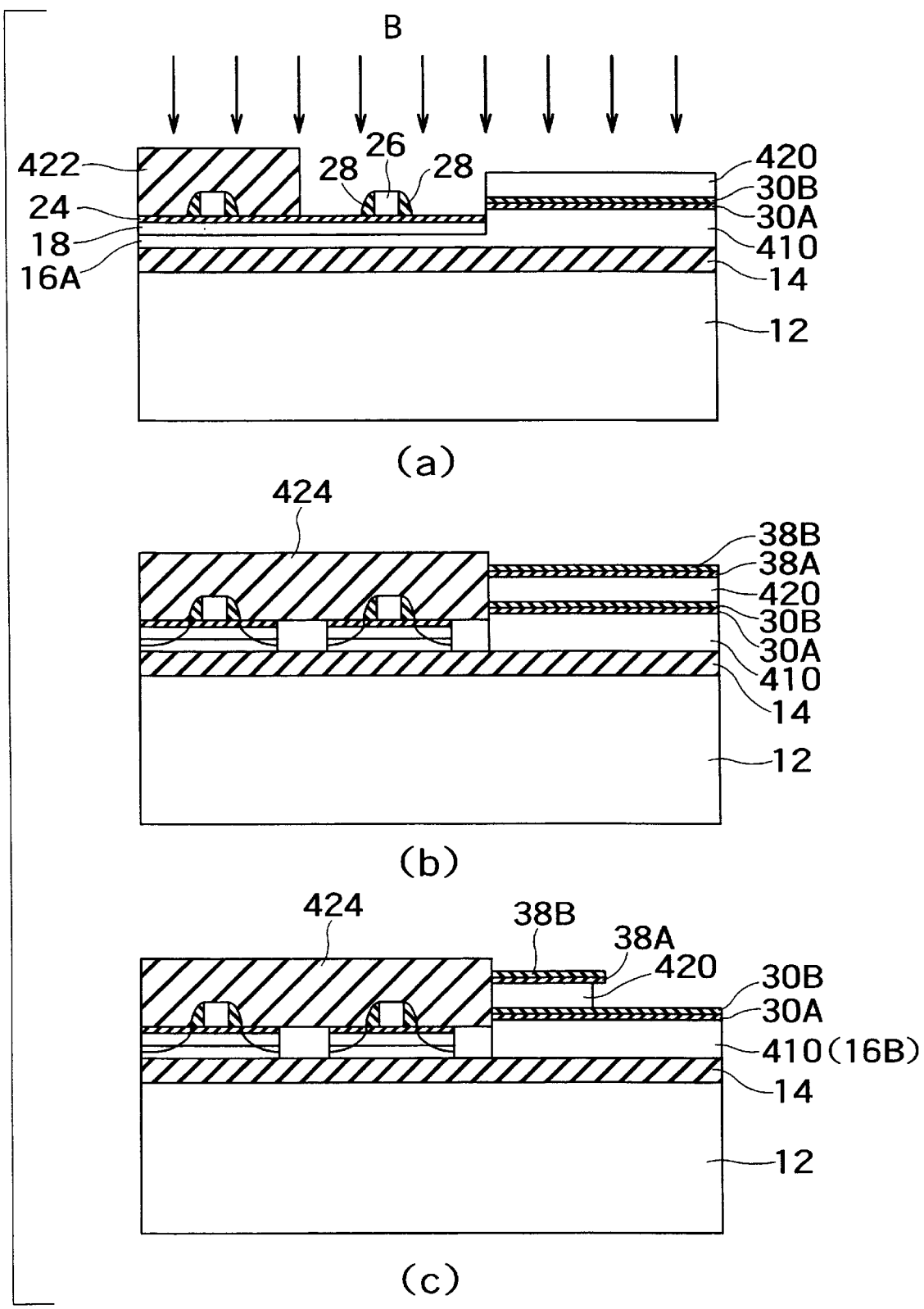
FIG. 13 is a sectional view showing main steps of a method of producing a semiconductor device according to the second embodiment of the present invention.
Figure 14:
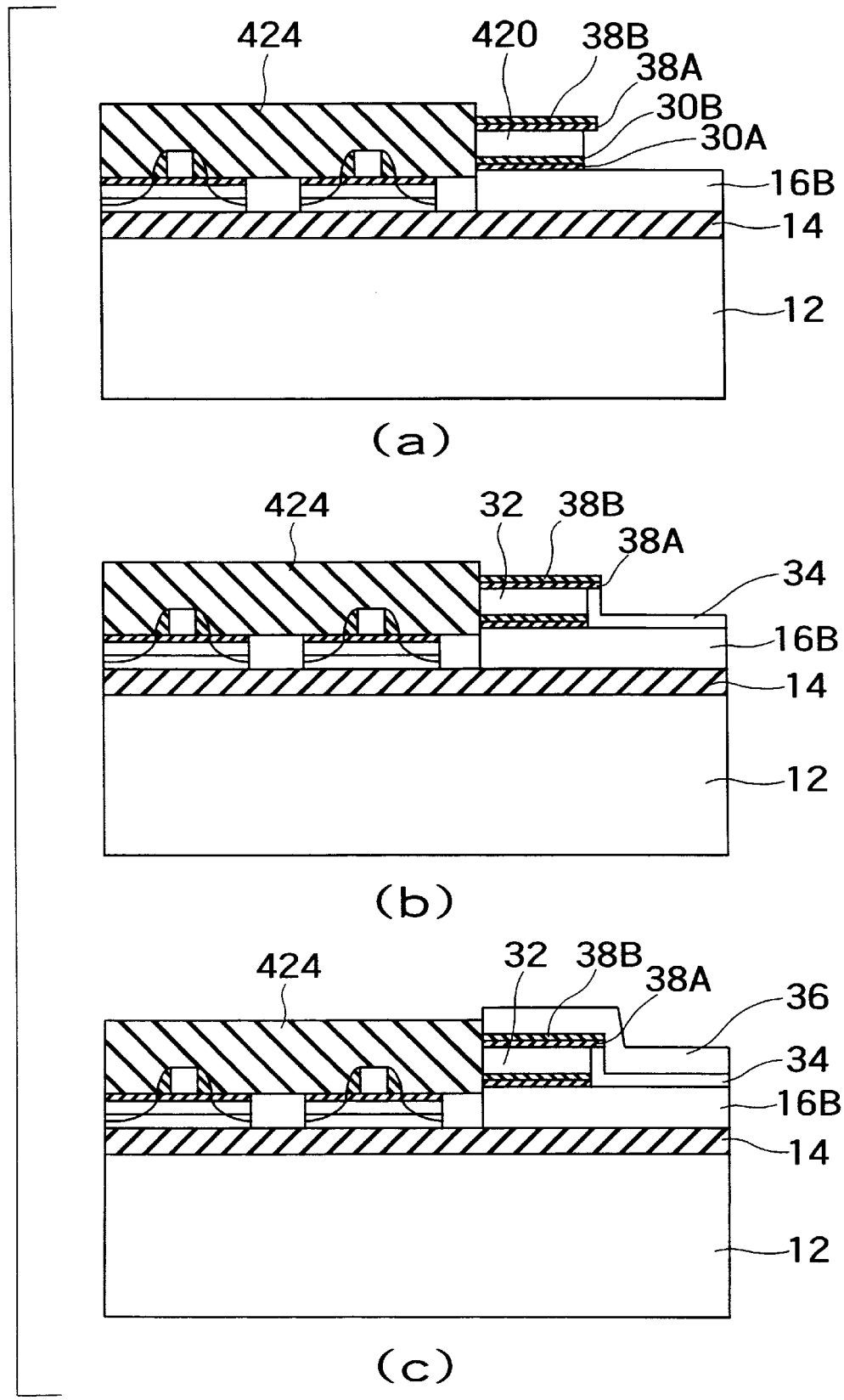
FIG. 14 is a sectional view showing main steps of a method of producing a semiconductor device according to the second embodiment of the present invention.

FIG. 9 is a schematic sectional view of main components of a semiconductor device according to the second embodiment of the present invention.

Transistors in this embodiment that are the same as or analogous to the transistors shown in FIGS. 1 to 8 are referenced by the same reference numbers.

Also in this embodiment, a buried-oxide film 14 is formed on an Si substrate 12, with FET and HBT sections 10A and 10B formed thereon.

The FET section 10A will be disclosed first.

Laminated on the buried-oxide film 14 are a lattice-relaxed SiGe buffer layers 16A and strained Si layers 18, with gate electrodes 26 and source/drain electrodes 29 formed on the layers 18, thus constituting a CMOSFET section.

Each gate electrode is formed by depositing polycrystalline Si layer on a 3 nm-thick gate-insulating film 24. The film 24 is formed by thermal oxidation to the surface of each strained Si layer 18.

The HBT section 10B will be explained next.

Formed on the insulating film 14 are a collector layer 16B made of lattice-relaxed n-type SiGe, a 50 nm-thick base layer 34 made of lattice-relaxed p-type SiGe and an emitter layer 36 made of n-type Si. Insulating films 30A and 30B, an outer base 32 and other insulating films 38A and 38B are provided on or under these layers.

In this embodiment, Ge-concentration is different between the SiGe buffer layer 16A and the SiGe collector layer 16B. In detail, the buffer layer 16A has higher Ge concentration than the collector layer 16B. This feature offers higher FET mobility while preventing degradation of the HBT characteristics.

Disclosed next is a method of producing a semiconductor device in this embodiment.

FIGS. 10 to 14 are sectional view showing main steps of a method of producing a semiconductor device in this embodiment.

As shown in FIG. 10(a), a 150 nm-thick $Si_{0.9}Ge_{0.1}$ layer 404 and a 5 nm-thick Si cap-layer 406 are formed on an SOI substrate 400 (about 20 nm in thickness for an SOI layer 402) having a 100 nm-thick buried-oxide film by UHV-CVD, MBE or LP-CVD. The thickness for each layer is far thinner than a critical thickness for no defects to occur, such as misfit dislocation.

The wafer is then put into a furnace for thermal oxidation for formation of a 150 nm-thick thermal oxide film 408 shown in FIG. 10(b) at 1100° C. using oxygen gas diluted with nitrogen. This thermal-oxidation process allows diffusion of Ge atoms of the SiGe layer 404 formed by a thin-film deposition technique into the crystal layers 404 and 402 on the buried-oxide film 14, however, not into the film 14 and also a thermal oxide film 408 provided at the surface side. In other words, the Ge atoms condense into the crystal layers 404 and 402 as thermal oxidation progresses towards the SiGe layer 404. This results in a 100 nm-thick SiGe layer 410 with 15%-Ge composition and a 150 nm-thick thermal oxide layer 408 remaining on the buried-oxide film 14.

The oxide film 408 that covers the entire surface of the SiGe layer 410 is once removed followed by deposition of a 5 nm-thick oxide film 30A by CVD. The oxide film 30A is then covered with a 10 nm-thick nitride film 30B by CVD.

Portions of the deposited nitride film 30B and oxide film 30A are etched away for producing an MOSFET by photolithography to expose the surface of the SiGe layer 410, as shown in FIG. 11(a). In detail, a resist (not shown) is applied over the nitride film 30B and an opening is formed only for the portion to be etched followed by removal of the nitride film 30B by dry-etching and then removal of the oxide film 30A by HF treatment.

The resist is removed and the wafer is put into the furnace for thermal oxidation again for thermal oxidation of the opening, as shown in FIG. 11(b). The thermal oxidation forms a 130 nm-thick thermal oxide film 416 at 1100° C. so that the SiGe layer 410 becomes a thin layer. The surface thermal-oxide layer 416 does not have any Ge. In other words, Ge are forced to move to the crystal layer 410 as oxidation progresses. Moreover, Ge atoms trapped between the buried-oxide layer 14 and the surface thermal oxide layer 416 are not allowed to pass through the layer 14, so that Ge concentration is higher as the SiGe layer becomes thinner. This results in an about 30 nm-thick SiGe layer 16A with 45%-Ge composition and the thermal oxide layer 416 remaining on the buried-oxide film 14. Oxidation will not progress for the portion covered with the nitride film 30B except the opening.

Generally, a strained Si layer has enhanced mobility of electrons or holes (holes in particular) in accordance with the strength of strain. Ideal application of strain is 1% or more which corresponds to about 25% or more for Ge concentration to the underlying SiGe layer 16A. An about same thickness for the lattice-relaxed SiGe layer 16A and the strained Si layer formed thereon could cause partial-stress application to the layer 16A due to the balanced stress between the two layers. This requires Ge concentration in the range from 40% to 60% to the underlying SiGe layer 16A for applying strain of 1% or more to the strained Si layer.

Moreover, the short channel effect cannot be disregarded for microfabrication of FETs with gate length at 0.1 μm or less. It is known that an SOI structure having an SOI layer with thickness of about 20 nm or less depresses the short channel effect. As discussed, a very thin SiGe layer 16A formed on the buried-oxide layer 14 with high Ge concentration benefits CMOS fabrication.

Reverse injection of hole can be restricted with not so much valence-band discontinuity between the emitter and base in the HBT section. The HBT section may not have a high Ge concentration for the SiGe layer 16B because a high Ge concentration for the layer 16B could cause difficulty in fabrication, restricted critical film thickness, and so on. Moreover, a very thin SiGe layer 16B could have a high resistance which is not adequate for a collector electrode to be formed. In other words, different from the CMOS section, a thin SiGe layer 16B with high Ge concentration will not benefit the performance for the HBT section. It is practical to have a thin SiGe layer 16A with high Ge concentration in the CMOS section only.

Next, arsenic ions are implanted into the HBT section covered with the nitride film 30B for formation of a highly concentrated collector, as shown in FIG. 12(a). The arsenic ions are blocked by the about 130 nm-thick thermal oxide film 416 so that they will not reach the SiGe layer 16A in the FET section.

As shown in FIG. 12(b), the thick oxide film 416 is then removed from the FET section to expose an 30 nm-thick $Si_{0.55}Ge_{0.45}$ layer, with cleaning the surface thereof. A 15 nm-thick strained Si layer 18 and a 3 nm-thick thermal oxide film 418 are formed on the $SiO_{0.55}Ge_{0.45}$ layer in this order. The strained Si layer 18 is not formed on the nitride film 30B in the HBT section but only in the FET section in a selective mode. The thin thermal oxide film 418 is also not formed on the nitride film 30B in the HBT section.

Subsequently, as shown in FIG. 12(c), an about 100 nm-thick polycrystalline Si layer 420 is deposited all over the wafer surface, covering all over the FET and HBT sections.

The polycrystalline Si layer 420 in the FET section is patterned to form a gate 26 and also a side-wall sections 28 as shown in FIG. 13(a). Arsenic or boron ions are implanted for an n-type or p-type FET in the FET section to lower the resistance of the polycrystalline Si gate layer 26 and also source/drain areas 18C and 18D. Ion implantation to the polycrystalline Si layer 420 in the FET section can be performed simultaneously with boron-ion implantation to the FET section because the layer 420 will become a base-leading electrode (an outer base). FIG. 13(a) illustrates boron-ion implantation to the HBT section and the p-type area while the n-type area has been covered with a passivation film 422. In other words, this process simultaneously forms the gate in the FET section and the outer base (base-leading section) in the HBT section.

The polycrystalline Si layer 420 is used in this embodiment. However, polycrystalline SiGe is also useful for high-performance transistors, which provides an SiGe intrinsic base layer in the HBT section, thus the resistance could be lowered when SiGe is also used for the outer base. Also, in the FET section, a polycrystalline SiGe used for the gate could achieve high carrier activation, lower resistance and restriction of growth of depletion layer at the channel side, and so on, when impurities are implanted at high concentration to the polycrystalline side.

The process goes to steps for covering the wafer surface with an oxide (passivation) film 424 by CVD and forming the HBT section after the resistance of the polycrystalline Si gate 26 and the source/drain areas 18C and 18D are lowered in the FET section. In the HBT section, as shown in FIG. 13(b), a 50 nm-thick oxide film 38A and a 50 nm-thick nitride film 38B are deposited by CVD on the boron-implanted polycrystalline Si layer 420.

Subsequently, as shown in FIG. 13(c), the portions of the nitride film 38B and the oxide film 38A, which correspond to the intrinsic base, are opened. This is followed by etching the boron-implanted polycrystalline Si layer 420 to remove a portion of the layer 420 under the mask, the nitride film 38B and the oxide film 38A, under etching control. The etching process results in that the nitride film 38B and the oxide film 38A stick out like a "visor".

Next, as shown in FIG. 14(a), the thin nitride film 38B and the oxide film 38A formed on the collector section 16B are removed. Here, the nitride film 38B is removed by dry-etching, however, the thick nitride film portion 38B that covers the outer base 32 remains.

After the portion of the collector section 16B is exposed, the exposed surface is cleaned, followed by forming a 50 nm-thick boron-implanted $Si_{0.85}Ge_{0.15}$ layer 34 in a selective mode. This results in the intrinsic base layer 34 formed such that it is joined to the collector area 16B and also to the outer base 32 under the visor-like nitride film 32B and oxide film 32A that cover the outer base.

Subsequently, as shown in FIG. 14(c), an Si layer 36 is formed on the intrinsic base 34 with no dopant addition, followed by arsenic ion implantation so that the Si layer 36 becomes an emitter. Impurities may be doped to the Si layer 36 during the epitaxial growth. The intrinsic base 34 may be formed as the graded composition structure in which Ge composition is gradually increased from 15% to 30% to accelerate electron mobility in the base for high-performance transistors.

After these processes, the surface is opened for contact with formation of electrodes made of alumna, etc., to finish the semiconductor device as shown in FIG. 9.

(Third Embodiment)

Figure 15:
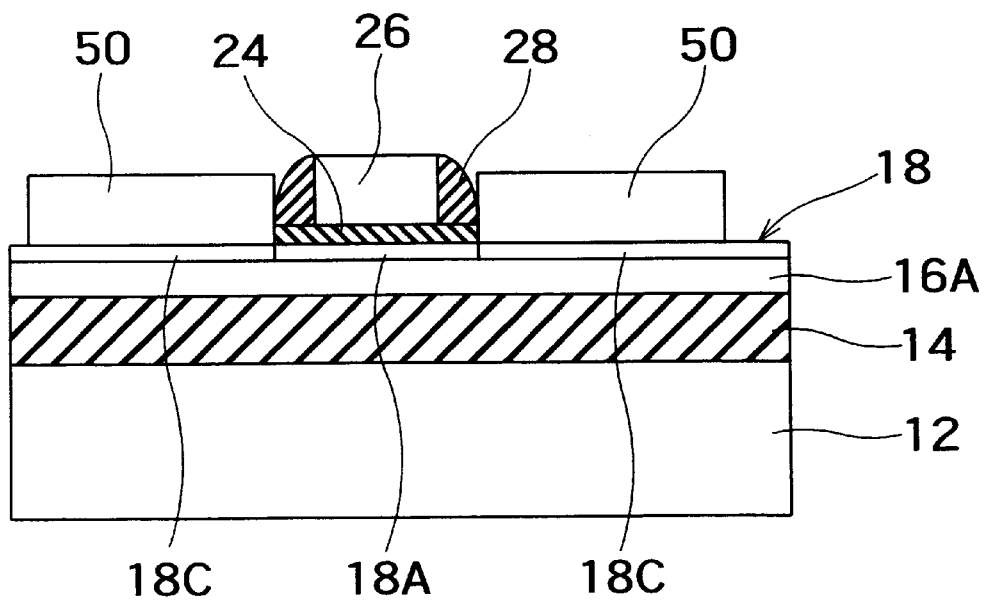
FIG. 15 is a schematic sectional view of the structure of a semiconductor device according to the third embodiment of the present invention.
Figure 16A:
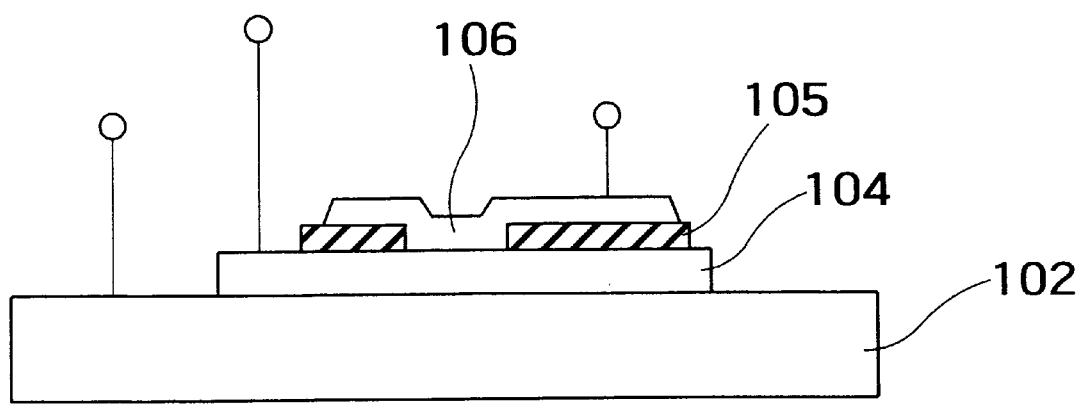
FIG. 16A is a sectional view of the structure of main components of a known HBT.
Figure 16B:
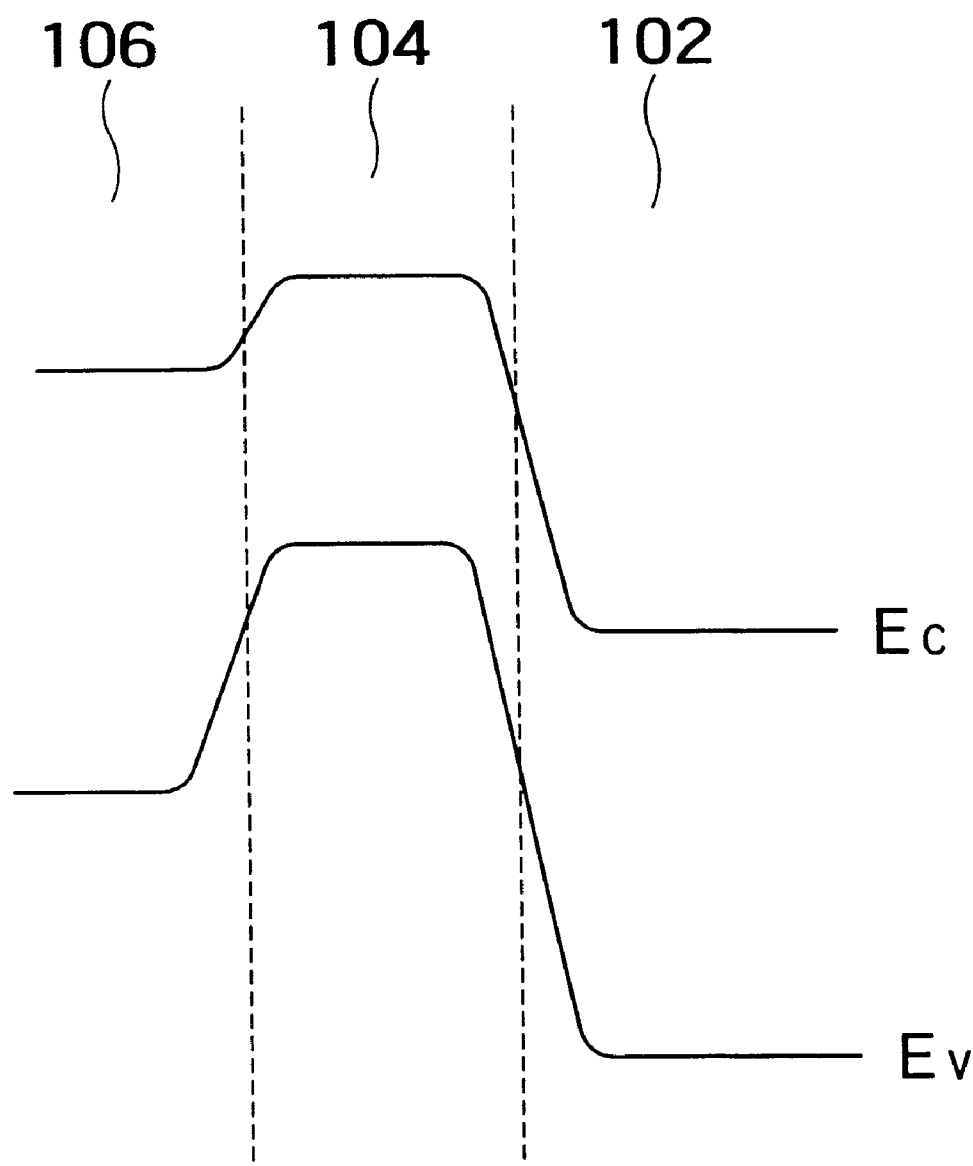
FIG. 16B is a schematic view showing an energy band structure for the main sections of the known HBT.

A semiconductor device according to the third embodiment of the present invention will be disclosed with reference to FIG. 15.

FIG. 15 is a schematic sectional view of the components of a semiconductor device according to the third embodiment of the present invention, the FET section only shown for brevity.

A buried SiO$_2$ layer 14 is formed on an Si substrate 12. An SiGe layer 16A is formed on the SiO$_2$ layer 14, at 10 nm in thickness and 50% in Ge concentration. A 7 nm-thick strained Si layer 18 is formed on the SiGe layer 16A. The strained Si layer 18 has a channel section 18A and a source/drain section 18C. Laminated on the channel section 18A is a 3nm-thick gate oxide film 24 and a 100 nm-thick polycrystalline Si gate 26. The gate 26 is formed with side-walls 28 at both sides.

This structure having very thin semiconductor layers 16A and 18 between the buried-oxide layer 14 and the gate oxide layer 24 restricts the short channel effect which would occur in a short gate-length structure whereas increases the resistance of the source/drain section 18C.

Such problem will be solved by a thick semiconductor layer 50 in the source/drain section. Such a thick semiconductor layer 50 is formed by, generally, a thin-film deposition technique, for example, a selective deposition technique. In detail, after the gate 26 has been formed, the surface crystal portion of the source/drain section 18C is exposed, followed by thin-film formation of the semiconductor crystals only on the exposed surface-crystal portion to provide the thick source/drain section 18C.

Addition of dopants at high concentration is required to the source/drain section that has become thick by selective deposition for lowering the resistance of the source/drain section 18C. The dopant addition may be a known ion implantation or dopant addition simultaneously with thin-film formation.

Although not shown in this embodiment, the HBT section is formed like the first and second embodiments.

The complex element disclosed in the present invention can be combined with memory devices such as DRAMs. Such memory devices may not have an SOI structure by removing the layers formed on a buried-oxide film and exposing the underlying crystals followed by forming the memory. Moreover, in this case, after 30 the buried-oxide film is removed, another Si crystal layer can be formed on the section to be formed as a memory so as not have a step between the memory section and the FET/HBT section (Bi-CMOS section).

As disclosed above, the present invention achieves an MOSFET with higher mobility with a strained Si layer as a channel layer provided on a lattice-relaxed SiGe layer formed on an insulating film.

Moreover, the present invention achieves high-speed CMOS and HBT with materials of the same type by easy element isolation processes with fabricating the HBT having a lattice-relaxed SiGe collector layer on an insulating film, with a thin SiGe base layer and an Si emitter layer laminated thereon.

Additional advantages and modifications will readily occur to those skilled in the art. Therefore, the invention in its broader aspects is not limited to the specific details and representative embodiments shown and described therein. Accordingly, various modifications may be made without departing from the spirit or scope of the general inventive concept as defined by the appended claims and their equivalents.

What is claimed is:

1. A semiconductor device comprising:
   a insulating layer;
   a field effect transistor including a buffer layer composed of a first semiconductor, formed on the insulating layer, and a strained semiconductor layer composed of a second semiconductor having a lattice constant smaller than that of the first semiconductor, formed on the buffer layer, the strained semiconductor layer being provided with a channel area, a source area and a drain area; and
   a bipolar transistor including a collector layer composed of a third semiconductor, formed on the insulating layer, a base layer composed of a fourth semiconductor having a lattice constant about the same as or larger than that of the third semiconductor, formed on the collector layer, and an emitter layer composed of a fifth semiconductor having a lattice constant smaller than those of the third and fourth semiconductors formed on the base layer.

2. The semiconductor device according to claim 1, wherein the main component of each of the first and the third semiconductors is SiGe, the main component of the second and the fifth semiconductors is Si, and the forth semiconductor being substantially the same as the third semiconductor.

3. The semiconductor device according to claim 2, wherein the buffer, the collector and the base layers include carbon.

4. The semiconductor device according to claim 2, wherein the base layer has Ge concentration decreasing in the base layer in a direction from the collector layer to the emitter layer.

5. The semiconductor device according to claim 2, wherein the SiGe layer for the first semiconductor has Ge concentration of 10% or more but 60% or less whereas the SiGe layer for the third semiconductor has Ge concentration of 5% or more but 30% or less.

6. The semiconductor device according to claim 1, wherein the main component of each of the first and the third semiconductors is SiGe, the first semiconductor having Ge concentration higher than that of the third semiconductor.

7. The semiconductor device according to claim 6, wherein the Ge concentration of the SiGe layer for the first semiconductor is 30% or more but 50% or less whereas the Ge concentration of the SiGe layer for the third semiconductor is 10% or more but 20% or less.

8. The semiconductor device according to claim 1, wherein the buffer layer is thinner than the collector layer.

9. The semiconductor device according to claim 1, wherein lattice strains applied to the buffer, the collector and the base layers are smaller than lattice strain applied to the strained semiconductor layer and the emitter layer.

10. The semiconductor device according to claim 1, wherein the field effect transistor includes an MOSFET of a first conductive type and another MOSFET of a second conductive type different from the first conductive type.

* * * * *